United States Patent
Laughery et al.

(10) Patent No.: US 6,792,328 B2
(45) Date of Patent: Sep. 14, 2004

(54) METROLOGY DIFFRACTION SIGNAL ADAPTATION FOR TOOL-TO-TOOL MATCHING

(75) Inventors: Michael Laughery, Austin, TX (US); David Wasinger, Scottsdale, AZ (US); Nickhil Jakatdar, Los Altos, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 272 days.

(21) Appl. No.: 10/109,955

(22) Filed: Mar. 29, 2002

(65) Prior Publication Data

US 2003/0187840 A1 Oct. 2, 2003

(51) Int. Cl.[7] .............................................. G06F 19/00
(52) U.S. Cl. ........................................ 700/121; 348/14
(58) Field of Search .......................... 700/121, 95, 96, 700/108, 110; 438/14, 16, 17

(56) References Cited

U.S. PATENT DOCUMENTS

| | | | |
|---|---|---|---|
| 6,161,054 A | 12/2000 | Rosenthal et al. | |
| 6,298,470 B1 | 10/2001 | Breiner et al. | |
| 6,388,253 B1 | 5/2002 | Su | |
| 6,636,843 B2 * | 10/2003 | Doddi et al. | 706/46 |
| 2002/0165636 A1 * | 11/2002 | Hasan | 700/121 |

* cited by examiner

Primary Examiner—Albert W. Paladini
Assistant Examiner—Zoila Cabrera
(74) Attorney, Agent, or Firm—Morrison & Foerster LLP (57) ABSTRACT

A method and system in integrated circuit metrology for adapting a metrology system to work with diverse metrology devices. One embodiment is a method and system for generating signal adjustment data to adapt measured diffraction signals to enable use of a library of diffraction signals and structure profiles created for a different metrology device. Another embodiment is the creation and use of a data store of diffraction adjustment vectors and metrology device specifications relative to a reference device specification.

28 Claims, 11 Drawing Sheets

METROLOGY DIFFRACTION SIGNAL ADAPTATION FOR TOOL-TO-TOOL MATCHING

CROSS-REFERENCE TO RELATED APPLICATIONS

This application relates to co-pending U.S. patent application Ser. No. 09/727,530, entitled "System and Method for Real-Time Library Generation of Grating Profiles" by Jakatdar, et al., filed on Nov. 28, 2000, to co-pending U.S. patent application Ser. No.(To be assigned) entitled "Metrology Hardware Specification Using a Hardware Simulator" by Bao, et al., filed on Mar. 26, 2002, and to co-pending U.S. patent application Ser. No. 09/737,705 entitled "System and Method for Grating Profile Classification" by Doddi, et al., filed on Dec. 14, 2000, all owned by the assignee of this application and incorporated herein by reference.

BACKGROUND OF THE INVENTION

1. Field of the Invention

The present invention relates to metrology for semiconductor manufacturing applications, and in particular to a method and system for adapting metrology systems to work with different metrology devices.

2. Related Art

As integrated circuits (IC's) evolve towards smaller critical dimensions (CD's) and faster response time, new challenges are encountered in the manufacturing processes. Accurate metrology for measurement of features with sizes on the order of 100 nm or smaller is desirable.

Optical metrology has emerged as an effective tool, with several advantages over other metrology methods such as Scanning Electron Microscopy (SEM). Optical probes are non-destructive, can be employed in production monitoring and control, and can be used for determination of thickness and topographic information as well as for CD measurement.

Known methods in scatterometry are used to reconstruct a diffraction grating profile from its optical diffraction responses, at a fixed incident angle and multiple wavelengths. A library-based methodology for profile extraction utilizes libraries of diffraction signals and simulated grating profiles which include such detailed profile characteristics as: rounding, footing, T-topping, material thickness variation, sidewall angles, and CD variation. Mask information, thin-film information such as parameters describing optical properties n & k, and thickness values, are inputs which are used to compute the diffraction signal of a collection of simulated profiles. To determine the profile of an integrated circuit structure, the diffraction signal is measured for that structure and compared with the library of simulated diffraction signals, and a best match is found, i.e., a profile whose simulated diffraction signal best matches the actual measured diffraction signal.

The diffraction signals are typically calculated by a grating response simulator which utilizes Rigorous Coupled-Wave Analysis (RCWA) analytical techniques, as described in the article "*Specular Spectroscopic Scatterometry*", *IEEE Transactions on Semiconductor Manufacturing*, Vol. 14, No. 2, May 2001, pp 97–111, by Niu et al. Other simulation algorithms may also be used to calculate the spectral scattering responses or diffraction signals. An integral method is described in "*Numerical Methods for the Analysis of Scattering from Nonplanar Periodic Structures*", A. R. Neureuther and K. Zaki, *Int'l URSI Symposium on Electromagnetic Waves, Stresa, Italy*, pp 282–285, 1969. A differential method is described in "*Systematic Study of Resonances Holographic Thin Film Coulers*", M Neviere et al, *Optics Communications*, Vol. 9, No. 1, pp 48–53, September 1973.

The hardware used in conjunction with metrology, which may include a metrology beam source, ellipsometer, reflectometer, and the like, is subject to parameters, which are not exactly reproducible. Examples of hardware-related variable parameters include: angle of metrology beam incidence, numerical aperture, wavelength range, polarization, and noise. The variation in hardware causes problems relating to metrology. The library diffraction signals are calculated according to inputs based on a particular set of hardware specifications, and according to ideal material characteristics. If the actual pieces of hardware and batch of material used in the measurement of a sample's diffraction signal have slightly different specifications or characteristics than those used in the library calculations, inaccuracies may be incurred when matching the measured diffraction signal to the calculated library diffraction signals. Typically, a library of diffraction signals and associated profile data is created for a specific metrology hardware model and other parameters. This library may not provide accurate results when used for another metrology tool even for a similar hardware device from the same manufacturer and the same model.

SUMMARY OF THE INVENTION

The present invention includes a method and system in integrated circuit metrology for adapting a metrology system to work with diverse metrology devices. The method comprises measuring a set of sites on a wafer with a first metrology device and a second metrology device, calculating differences between signals of the first set of diffraction signals and the corresponding signals of the second sets of diffraction signals and determining signal adjustment vectors. The signal adjustment vector is configured to enable metrology data created for the first metrology device to be used in a corresponding second metrology device, the metrology data may be a library of simulated diffraction signals and associated profiles. In one embodiment, identifying information about the first and the second metrology devices plus the associated signal adjustment vectors may be stored in a data store.

Another embodiment is a system for storing integrated circuit metrology signal adjustment data and responding to request for signal adaptation, the system comprising a query device configured to send a query including identifying information about a metrology device and identifying information about a library of diffraction signals and associated profiles, a signal adjustment server coupled to the query device and configured to process the query and further configured to format and transmit a response to the query device; and a data store coupled to the signal adjustment server and configured to store a signal adjustment data, identifying information about a metrology device, and identifying information about a library of diffraction signals and associated profiles.

DETAILED DESCRIPTION OF EXEMPLARY EMBODIMENT(S)

One embodiment of the present invention includes a method and system for adapting metrology data created to work with one metrology setup to become operative in another metrology setup. In order to facilitate description of the concepts and principles of the current invention, an exemplary ellipsometric optical metrology system will be discussed. However, the same concepts and principles equally apply to other optical metrology system such as reflectometric systems and the like, as well as other metrology systems wherein a library or database of diffraction signals and structure profiles are used.

Figure 1:
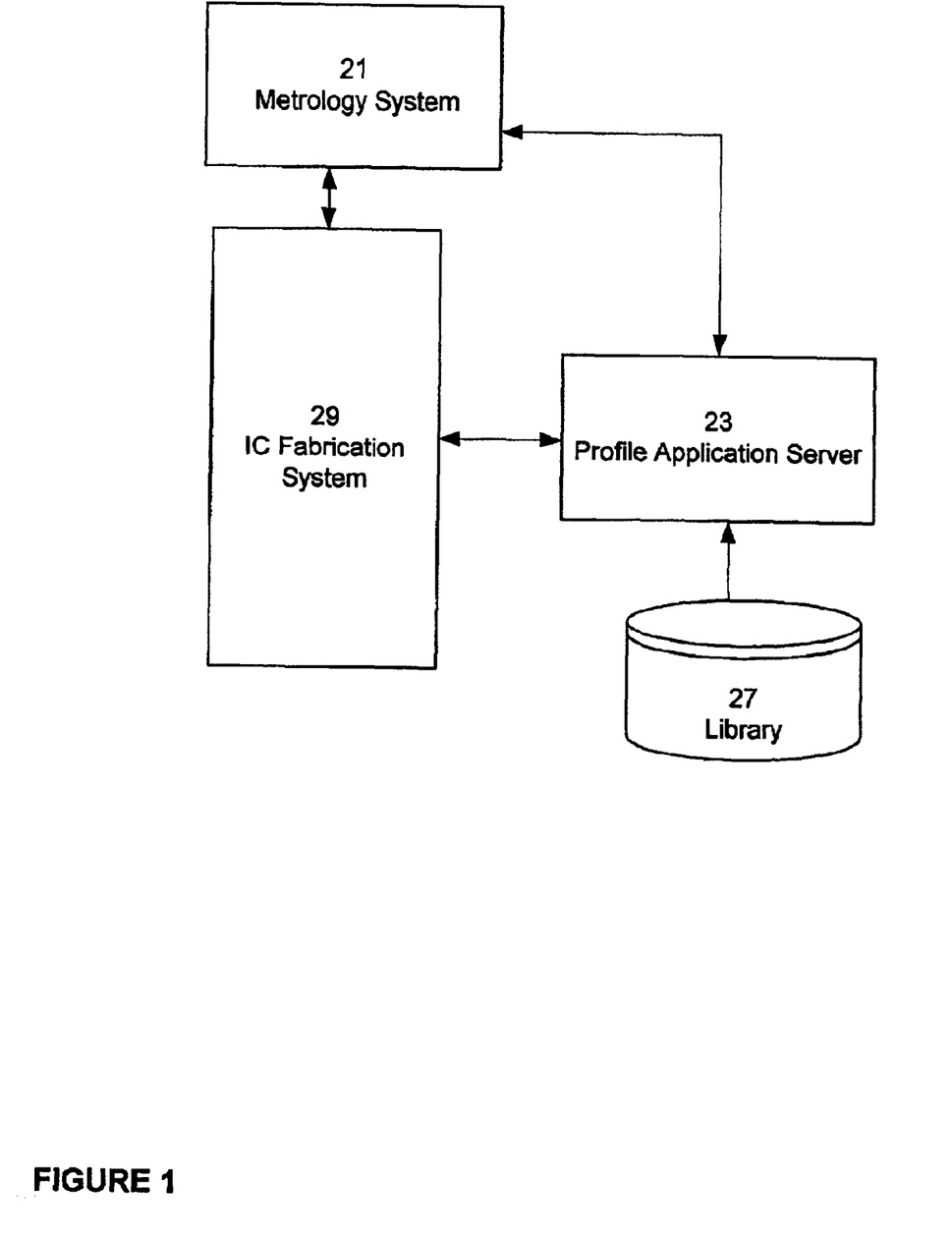
FIG. 1 is an architectural diagram illustrating a metrology system coupled to an integrated circuit fabrication system for measuring diffraction signals off structures.

FIG. 1 illustrates a metrology system coupled to an integrated fabrication system for measuring the diffraction signal off integrated circuit structures. The metrology system 21, which includes a metrology tool, is coupled to an IC fabrication system 29. The IC fabrication system may be a lithography unit or an etch unit. The metrology system 21 may be in-line or remotely coupled to the IC fabrication system 29. The metrology system 21 receives information from the IC fabrication system 29 regarding the samples or wafers to be measured. Once measurements are performed by the metrology system 21, the measured signals are transmitted to a profile application server 23. Coupled to the profile application server 23 is a library 27 of diffraction signal and associated profiles. The profile application server 23 determines the profiles associated with measured diffraction signals based on data from the library 27 and sends the profile data back to metrology system 21 and/or to the IC fabrication system 29.

Figure 2:
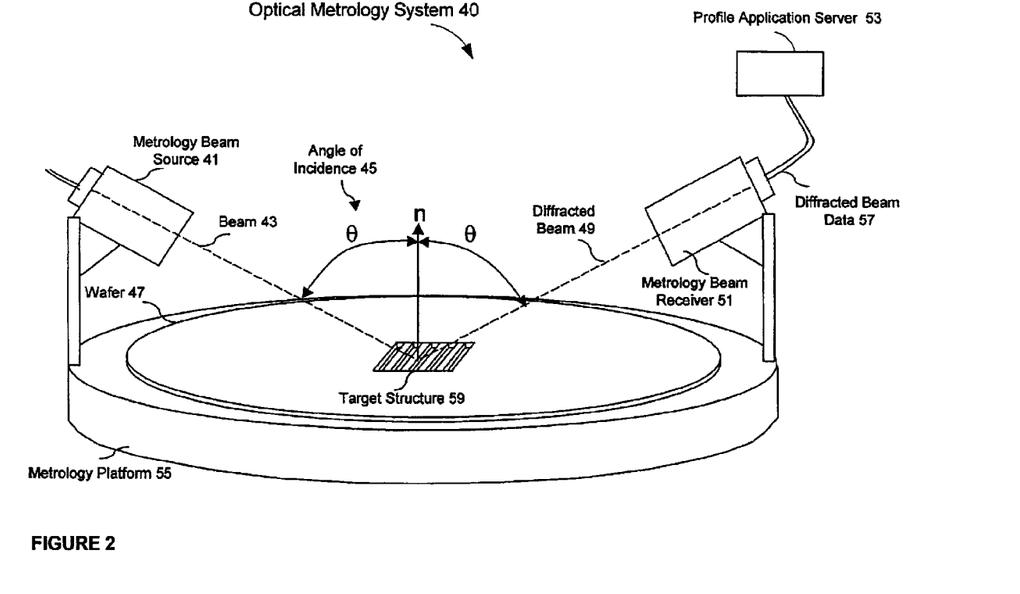
FIG. 2 is an architectural diagram illustrating the use of optical metrology to measure the diffraction signals off integrated circuit structures.

FIG. 2 is an architectural diagram illustrating the use of optical metrology to measure the diffraction signals off integrated circuit structures. The optical metrology system 40 consists of a metrology beam source 41 projecting a beam 43 at the target structure 59 of a wafer 47 mounted on a metrology platform 55. The metrology beam 43 is projected at an incidence angle θ towards the target structure 59. The diffracted beam 49 is measured by a metrology beam receiver 51. The diffracted beam data 57 is transmitted to a profile application server 53. The profile application server 53 compares the measured diffracted beam data 57 against a library of calculated diffracted beam data representing varying combinations of critical dimensions of the target structure and resolution. The library instance best matching the measured diffracted beam data 57 is selected. The profile and associated critical dimensions of the selected library instance correspond to the cross-sectional profile and critical dimensions of the features of the target structure 59. The optical metrology system 40 may utilize a reflectometer, an ellipsometer, or other optical metrology device to measure the diffracted beam or signal. An optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

Figure 3:
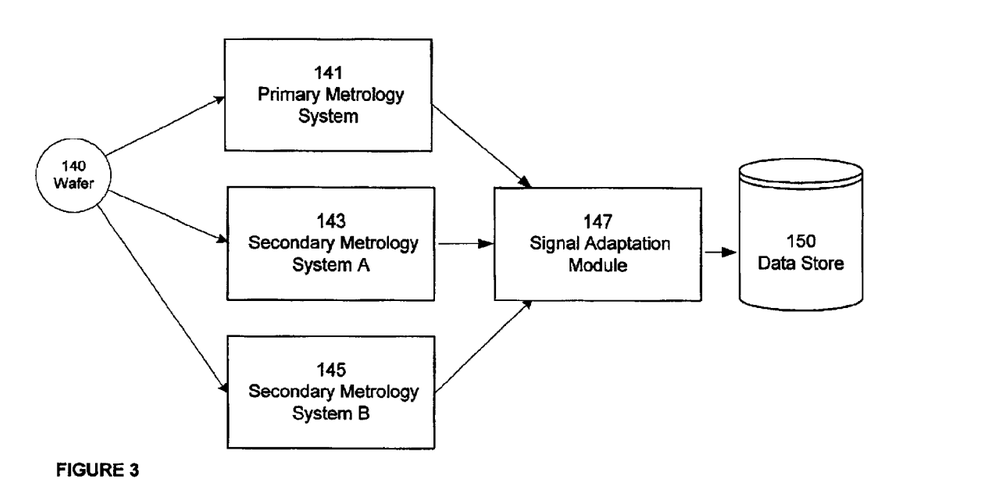
FIG. 3 is an architectural diagram illustrating the creation of signal adjustment vectors for one or more metrology systems in an exemplary embodiment of the present invention.

FIG. 3 is an architectural diagram illustrating the creation of signal adjustment vectors for one or more metrology systems in an exemplary embodiment of the present invention. As will be described in more detail below, a signal adjustment vector is a set of correcting elements that is used to adapt a diffraction signal measured using one metrology tool to become operative with a library created for a different metrology tool. A primary metrology tool is a metrology device such as an ellipsometer, reflectometer or the like, whose hardware and material specifications were used to create a library of simulated diffraction signals and associated structure profiles. In the present embodiment, measurement signals from a secondary metrology tool are adapted in order to become operative with a primary metrology tool library. A primary metrology system includes the primary metrology tool whereas a secondary metrology system includes a secondary metrology tool.

Referring to FIG. 3, selected sites in a wafer 140 are measured using a primary metrology system 141. The same selected sites are also measured using the secondary metrology systems A 143 and B 145. The diffraction signals collected by the primary 141 and secondary metrology systems, 143 and 145, are transmitted to a signal adaptation module 147. The signal adaptation module 147 determines a signal adjustment vector for each of the secondary metrology systems A 143 and B 145. Determination of signal adjustment vectors is discussed in FIG. 8 below. The signal adjustment vector generated by the signal adaptation module 147 may be transmitted to a remote user or saved in a signal adjustment data store 150.

Figure 4A:
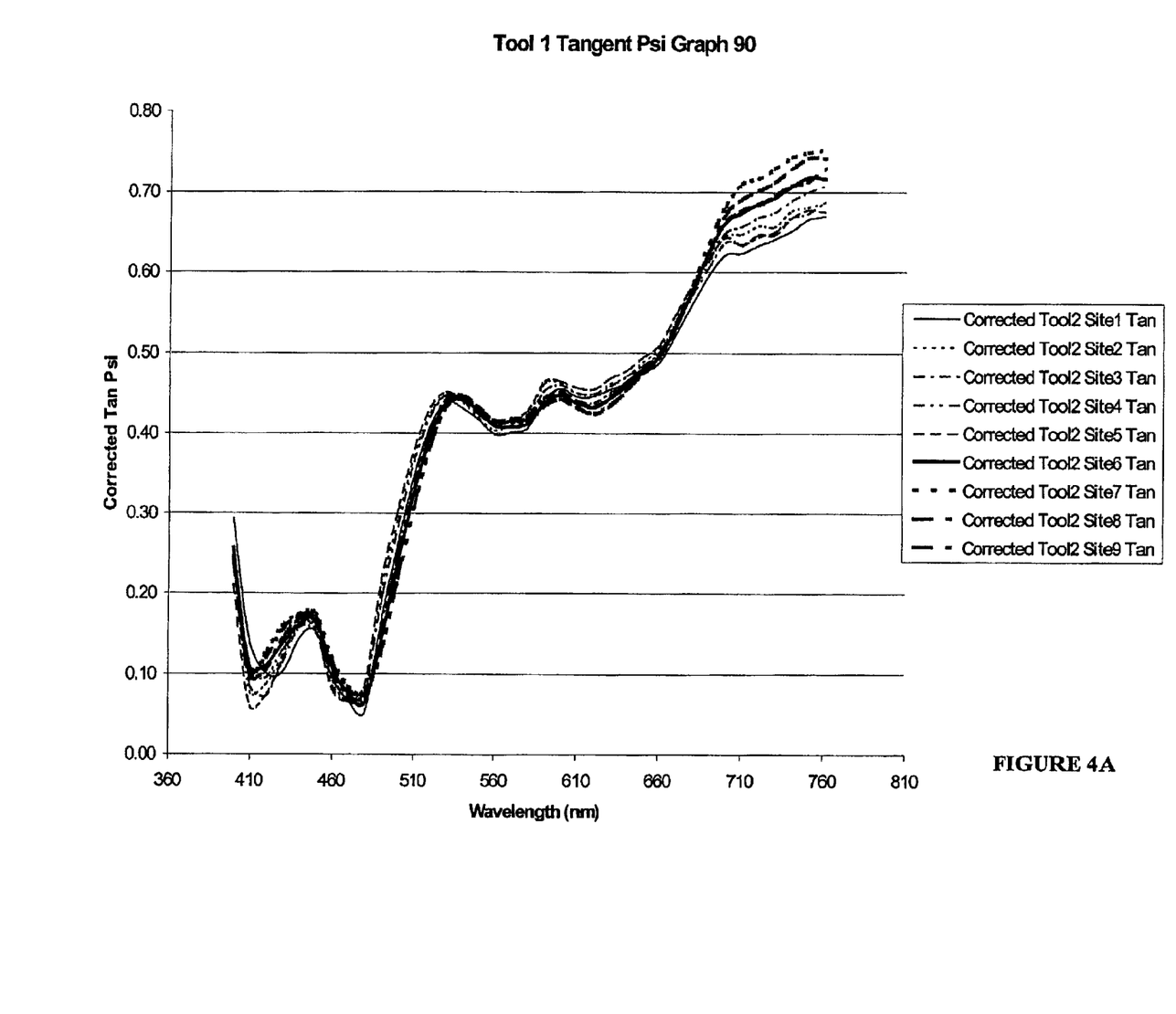
FIG. 4A is a chart illustrating the graphs of tangent (Ψ) for multiple sites in a wafer measured with a primary optical metrology tool.
Figure 4B:
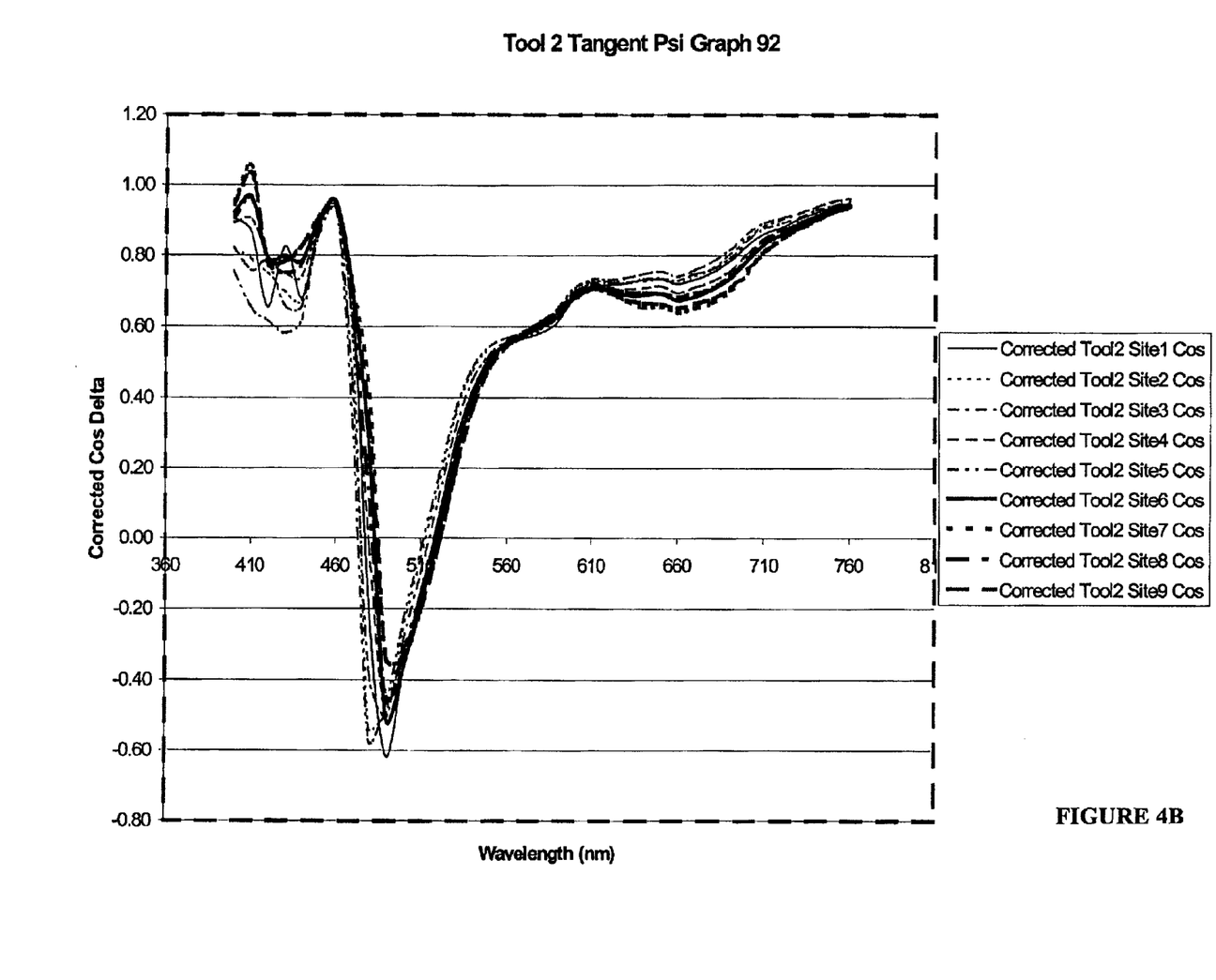
FIG. 4B is a chart illustrating the graphs of tangent (Ψ) for the same multiple sites in the wafer measured with a secondary optical metrology tool.

As an illustrative example, FIG. 4A is a chart illustrating the graphs of tangent (Ψ) for multiple sites in a wafer measured with a primary optical metrology tool, Tool 1, whereas FIG. 4B is a chart illustrating the graphs of tangent (Ψ) for the same multiple sites in the wafer measured with a secondary optical metrology tool, Tool 2. Nine sites in a wafer (not shown) were selected and measured with Tool 1 and Tool 2. In this case, Tool 1 and Tool 2 are ellipsometers. The tangent (Ψ) portion of the diffraction signals for the nine sites as measured by Tool 1 90 are shown in FIG. 4A. The corresponding tangent (Ψ) portion of the diffraction signals for the same nine sites as measured by Tool 2 92 are shown in FIG. 4B. Although the same sites in the wafer were measured using similar ellipsometers, (same manufacturer and model), there is a difference in the tangent (Ψ) values for Tool 1 versus Tool 2 for the same measurement point in the wavelength range. For example, the average value of tangent (Ψ) for Tool 1 is 0.42 at 560 nanometer (nm) wavelength as shown by A whereas the average value of tangent (Ψ) for Tool 2 is 0.36 at the same wavelength of 560 nm as shown by B. Thus a library of simulated diffraction signals and profiles generated for Tool 1 is not directly usable for processing measured diffraction signals using Tool 2 because profiles associated with the best match library diffraction signals would be different when measured with Tool 1 versus Tool 2. Similar differences occurred when the cosine (Δ) graphs of the same nine sites for Tool 1 and Tool 2 were analyzed.

Figure 5A:
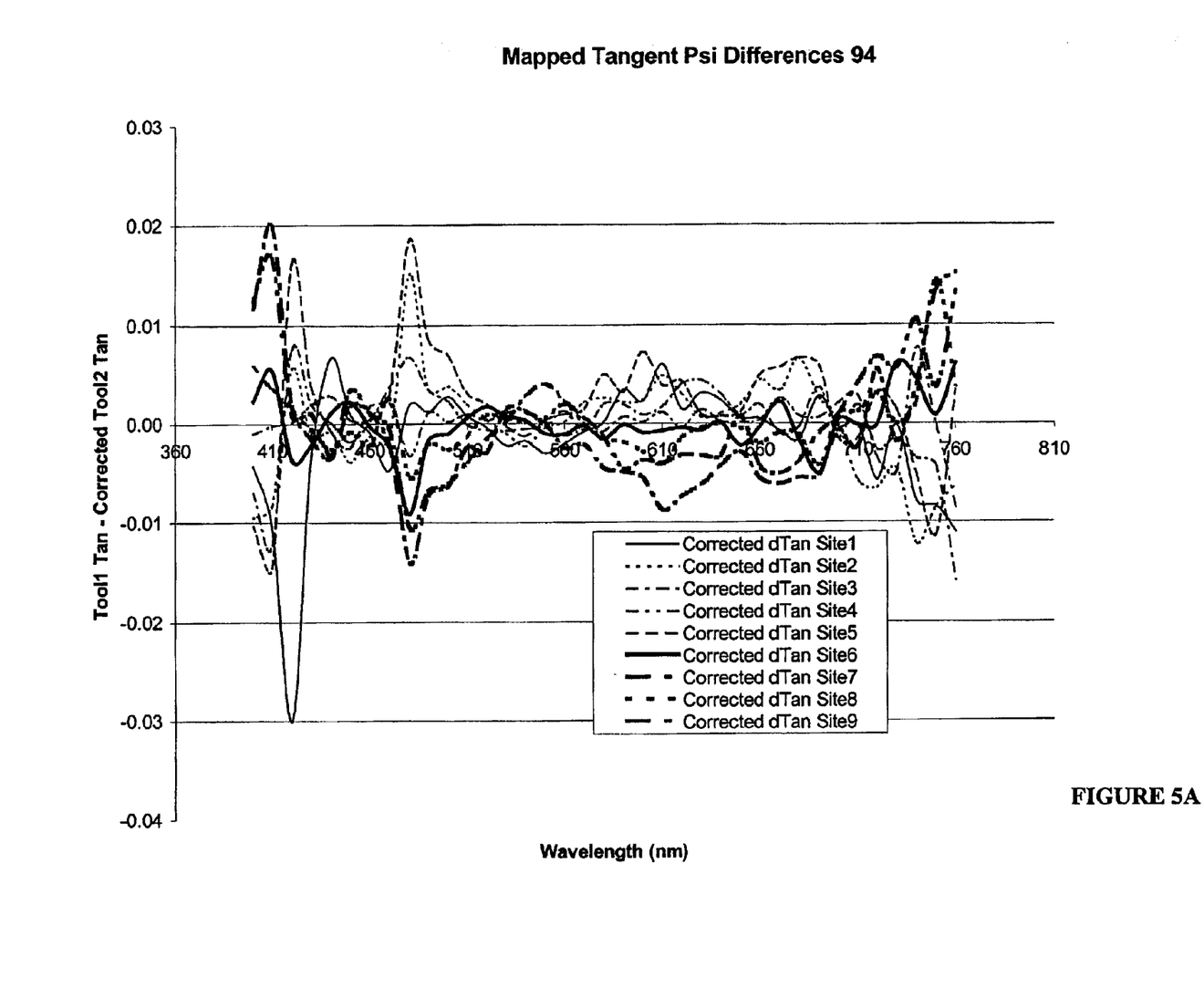
FIG. 5A is a chart illustrating the graphs of differences between the tangent (Ψ) for the primary optical metrology tool and the secondary optical metrology tool associated with the same sites in the wafer.
Figure 5B:
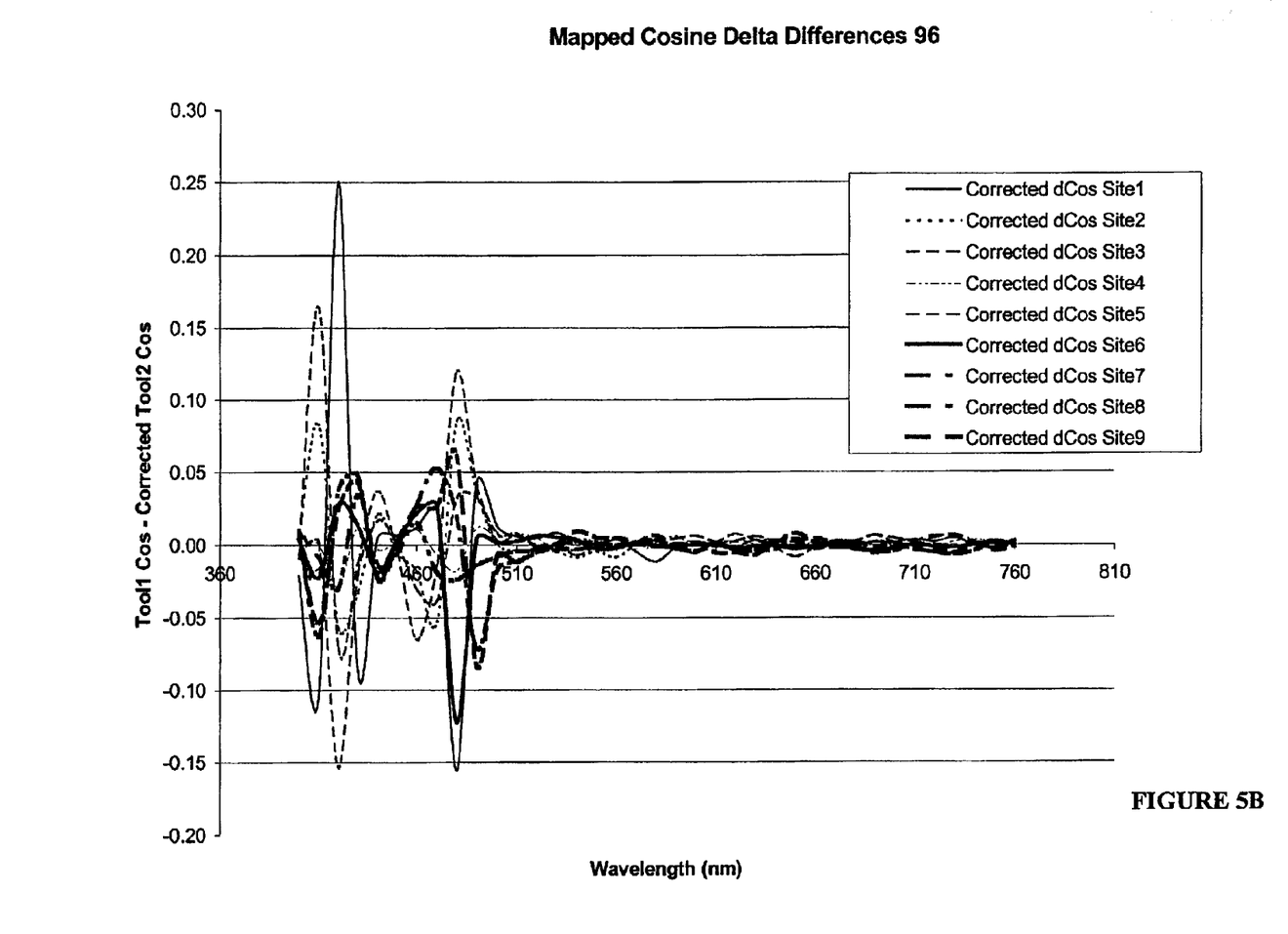
FIG. 5B is a chart illustrating the graphs of differences between the cosine (Δ) for the primary optical metrology tool and the secondary optical metrology tool associated with the same sites in the wafer.

FIG. 5A is a chart illustrating the graphs of differences between the tangent (Ψ) for Tool 1 and Tool 2 94 associated with multiple sites in the wafer whereas FIG. 5B is a chart illustrating the graphs of differences between the cosine (Δ) for Tool 1 and Tool 2 96 for the same multiple sites in the same wafer. The tangent (Ψ) and cosine (Δ) measurements for Tool 1 and Tool 2 are done at specific wavelength measurement points, the number of measurements points depending on the tool manufacturer. Several techniques can be used to average the tangent (Ψ) and cosine (Δ) differences at each wavelength measurement point including simple averaging, statistical averaging, and clustering algorithms.

Figure 6A:
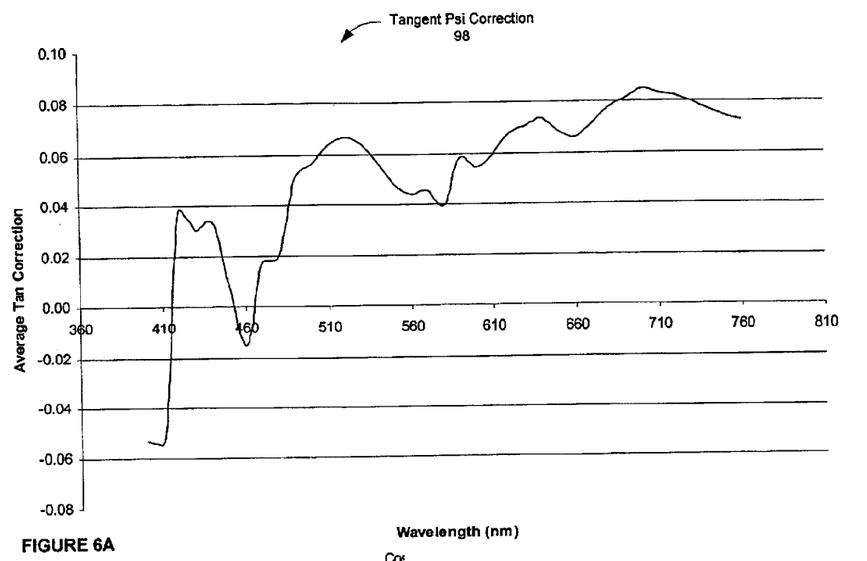
FIG. 6A is a chart illustrating the averaged tangent (Ψ) correction graph for the secondary optical metrology tool relative to the primary optical metrology tool.
Figure 6B:
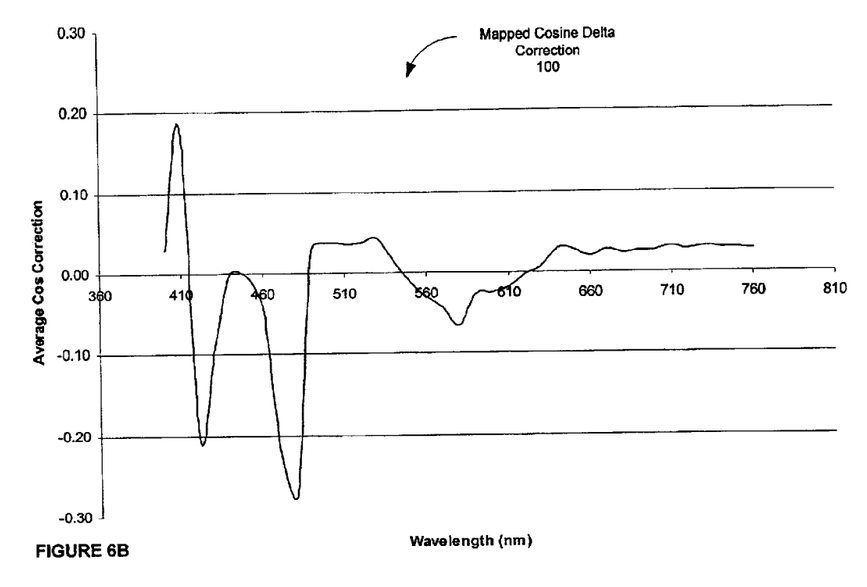
FIG. 6B is a chart illustrating the averaged cosine (Δ) correction graph for the secondary optical metrology tool relative to the primary optical metrology tool.

In one embodiment, the differences at each wavelength measurement point are averaged out for all the selected sites on the wafer, the differences calculated from measurements of the primary and secondary metrology tools. FIG. 6A is a chart illustrating the averaged difference graph of tangent (Ψ) where Tool 1 is the primary tool and Tool 2 is the secondary tool. Thus, the tangent (Ψ) correction graph 98 may be used to adjust a tangent (Ψ) measured graph performed on Tool 2 and use a library created for use with Tool 1. In a similar manner, FIG. 6B is a chart illustrating the averaged difference graph of cosine (Δ) 100 where Tool 1 is the primary tool and Tool2 is the secondary tool. By applying the signal correction data to the Tool 2 measured diffraction signals, a library created for use with Tool 1 can be used with Tool 2.

One embodiment includes a method of using correction graphs to adapt measurements performed with one metrology tool to use a library generated for use with another metrology tool. The difference between measurements of two tools for the same sites may also be expressed as a signal adjustment vector where the elements of the vector are the averaged measurement differences at the measurement points for the metrology tools used. For example, if a metrology tool takes diffraction signal measurement at 50 points in the wavelength range used for the tool, the signal adjustment vector would have 50 elements. Each element of the signal adjustment vector is a calculated average of the signal differences at the measurement point. As mentioned above, the vector elements may be calculated by simple averaging, by statistical averaging techniques, or by clustering of the measurement differences and determining a center for the cluster. For a description of a clustering algorithm using a heuristic to provide a near optimal solution, refer to co-pending U.S. patent application Ser. No. 09/737,705 entitled "System and Method for Grating Profile Classification" by Doddi, et al., filed on Dec. 14, 2000 which is incorporated in its entirety herein by reference.

Figure 7A:
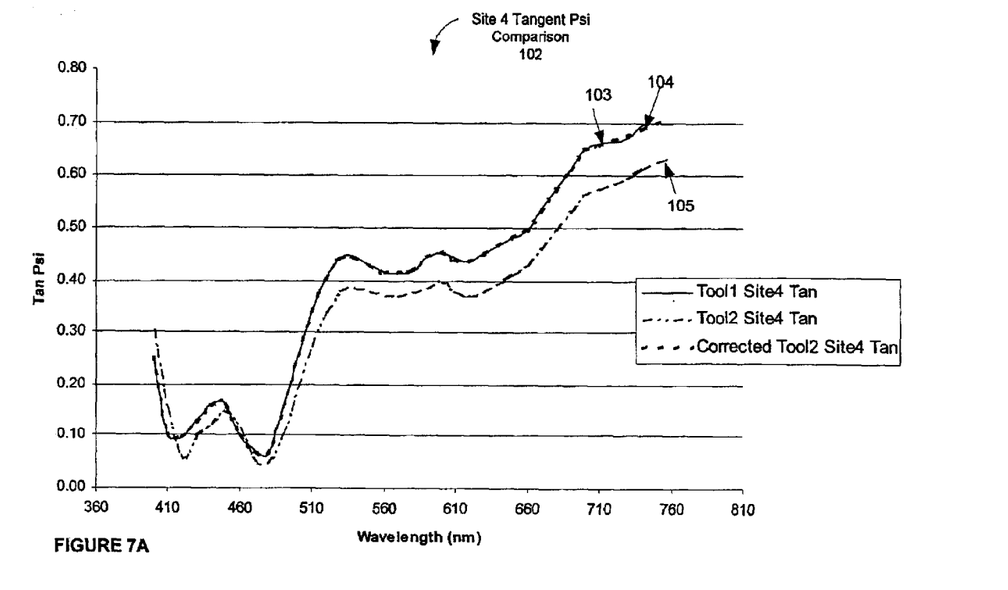
FIG. 7A is a chart illustrating the tangent (Ψ) graph for the primary tool, the uncorrected tangent (Ψ) graph for the secondary tool, and the corrected tangent (Ψ) graph for the secondary tool for a selected site in the wafer.
Figure 7B:
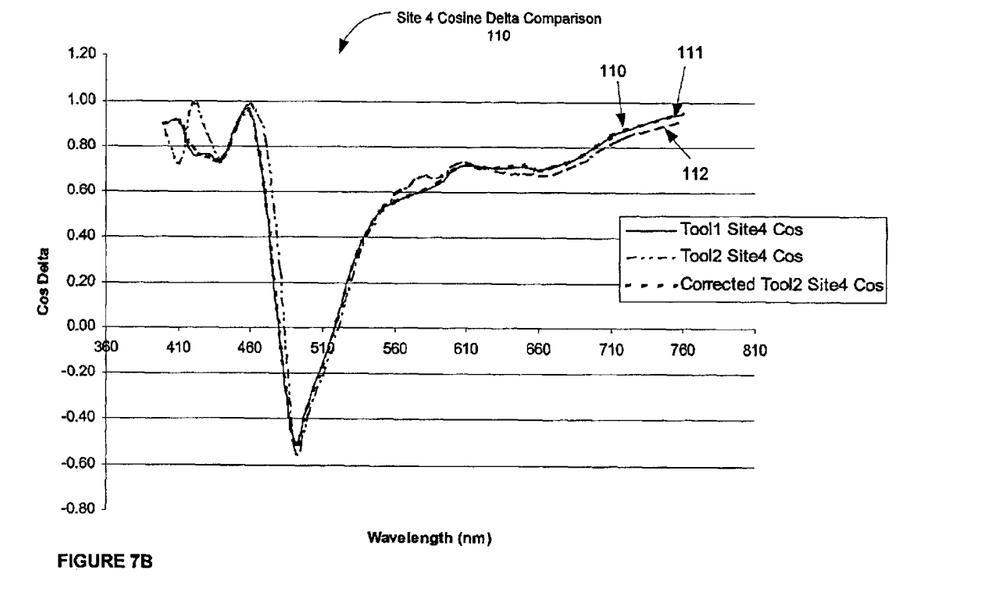
FIG. 7B is a chart illustrating the cosine (Δ) graph for the primary tool, the uncorrected cosine (Δ) graph for the secondary tool, and the corrected cosine (Δ) graph for the secondary tool for a selected site in the wafer.

In this example, to confirm the results of the method, a specific site measured by both Tool 1 and Tool 2 was selected, Site 4. FIG. 7A is a chart illustrating Site 4 tangent (Ψ) graph using Tool 1 103, the uncorrected tangent (Ψ) graph using Tool 2 105, and the corrected or adjusted tangent (Ψ) graph for Tool 2 104. As can be seen in FIG. 7A, the tangent (Ψ) graph using Tool 1 103 and the adjusted tangent (Ψ) graph for Tool 2 104 have a close fit. The signal adjustment vector used in FIG. 7A is a simple average of the signal differences for the selected sites. Similarly, FIG. 7A is a chart illustrating Site 4 cosine (Δ) graph using Tool 1 110, the uncorrected cosine (Δ) graph using Tool 2 112, and the corrected or adjusted cosine (Δ) graph for Tool 2 111. Again, the signal adjustment vector used in FIG. 7B is a simple average of the signal differences for the selected sites. Thus, by applying the signal adjustment vector to the measured diffraction signal off the integrated circuit structure, a library created for one metrology tool may be used in another metrology tool.

Figure 8:
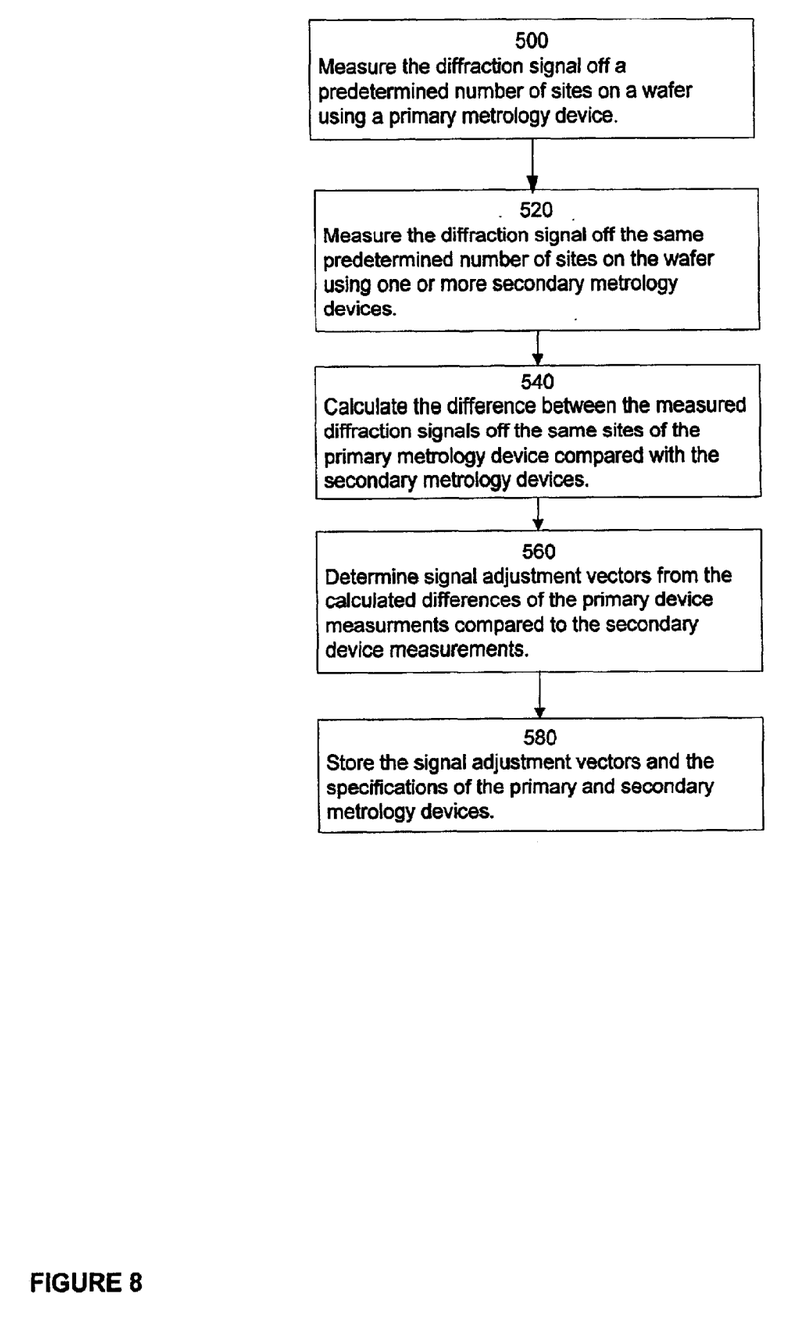
FIG. 8 is a flow chart outlining the steps for determining the signal adjustment vectors of secondary metrology devices in an exemplary embodiment of the present invention.

FIG. 8 is a flow chart outlining the steps for determining the signal adjustment vectors of secondary metrology tools relative to a primary metrology tool in one embodiment. In step 500, the diffraction signal off a predetermined number of sites on a wafer is measured using a primary metrology tool. The metrology tool may be an ellipsometer, reflectometer, and the like. The primary metrology tool is one with hardware specifications used in creating metrology data such as a library of diffraction signals and associated profiles. In step 520, the same predetermined number of sites is measured with one or more secondary metrology tools, the secondary metrology tools being of the same type or variety as that of the primary metrology tool. In step 540, the difference of the measured diffraction signals using the primary and the secondary metrology tools is calculated for corresponding sites.

Still referring to FIG. 8, in step 560, the signal adjustment vector is determined. As mentioned above, the vector elements may be calculated by simple averaging, by statistical averaging techniques, or by clustering of the measurement differences and determining a center for the cluster. Signal adjustment vectors for several secondary metrology tools may be calculated. In one embodiment, in step 580, the calculated signal adjustment vectors are stored or saved in a data store for use in networked environments.

Figure 9A:
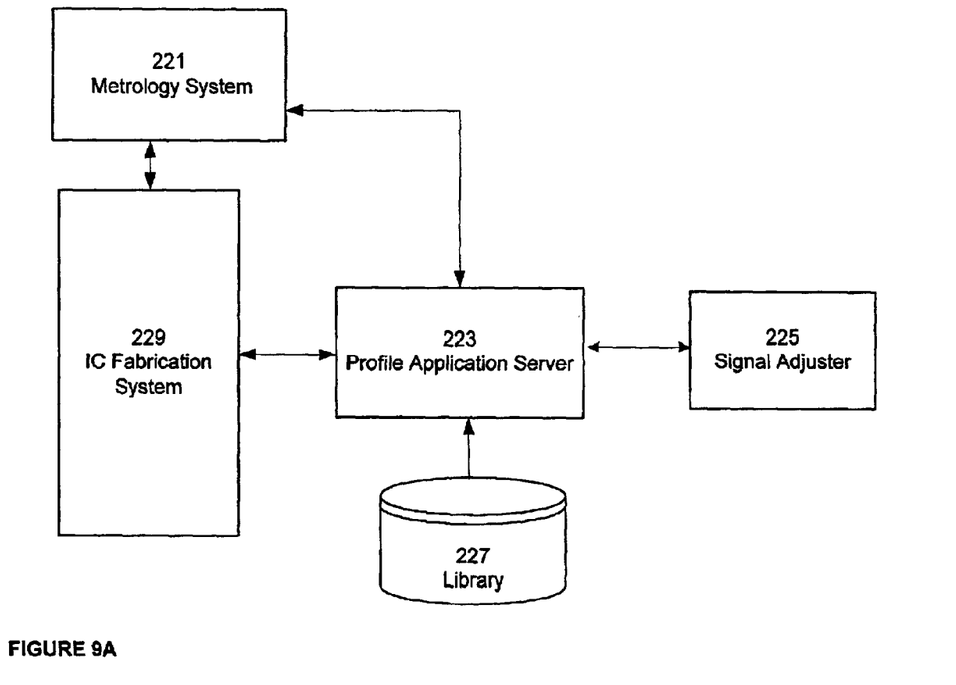
FIG. 9A is an architectural diagram illustrating a signal adjuster in an exemplary embodiment of the present invention.

FIG. 9A is an architectural diagram illustrating a signal adjuster in one embodiment. A signal adjuster 225 is invoked by a profile application server 223, which is coupled to a metrology system 221. The metrology system 221 may be coupled to an IC fabrication system 229 such as a lithography unit or an etcher. Coupled to the profile application server is a profile library of diffraction signals and associated profiles 227. The profile library 227 was created for a first metrology tool, for example, a reflectometer. A second metrology tool, also a reflectometer, is part of the metrology system 221. The profile application server 223 invokes the signal adjuster 225 to apply the signal adjustment vector specifically calculated for the second metrology tool relative to the first metrology tool.

Figure 9B:
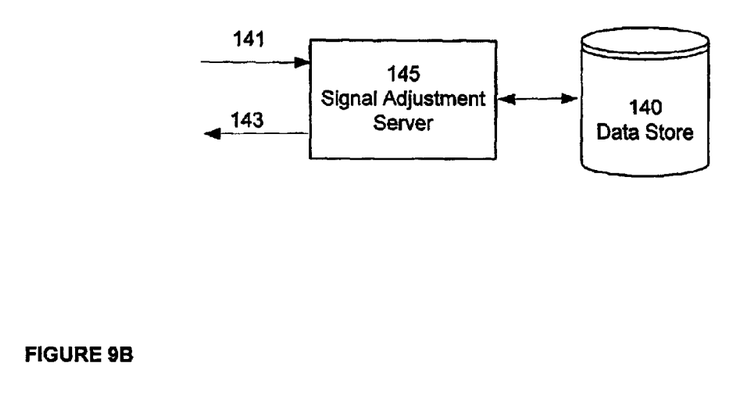
FIG. 9B is an architectural diagram of a signal adjustment vector server in one embodiment of the present invention.

FIG. 9B is an architectural diagram of a signal adjustment server in one embodiment. The signal adjustment data store 140 includes one or more signal adjustment data for one or more secondary metrology tools relative to a primary metrology tool and tool identifying information. The data store may include data for one or more primary metrology tools. A request 141 for signal adjustment is received by the signal adjustment server 145. The signal adjustment server 145 accesses the appropriate data store instance in the signal adjustment vector data store 140, transmits the signal adjustment data 143 to the requester. The requestor may be a remote metrology system or a local integrated metrology system. In another embodiment, the requestor transmits a measured diffraction signal 141 and a signal adjustment identifier and the signal adjustment server 145 accesses the appropriate signal adjustment data and transmits to the requestor an adjusted diffraction signal 143.

Figure 10:
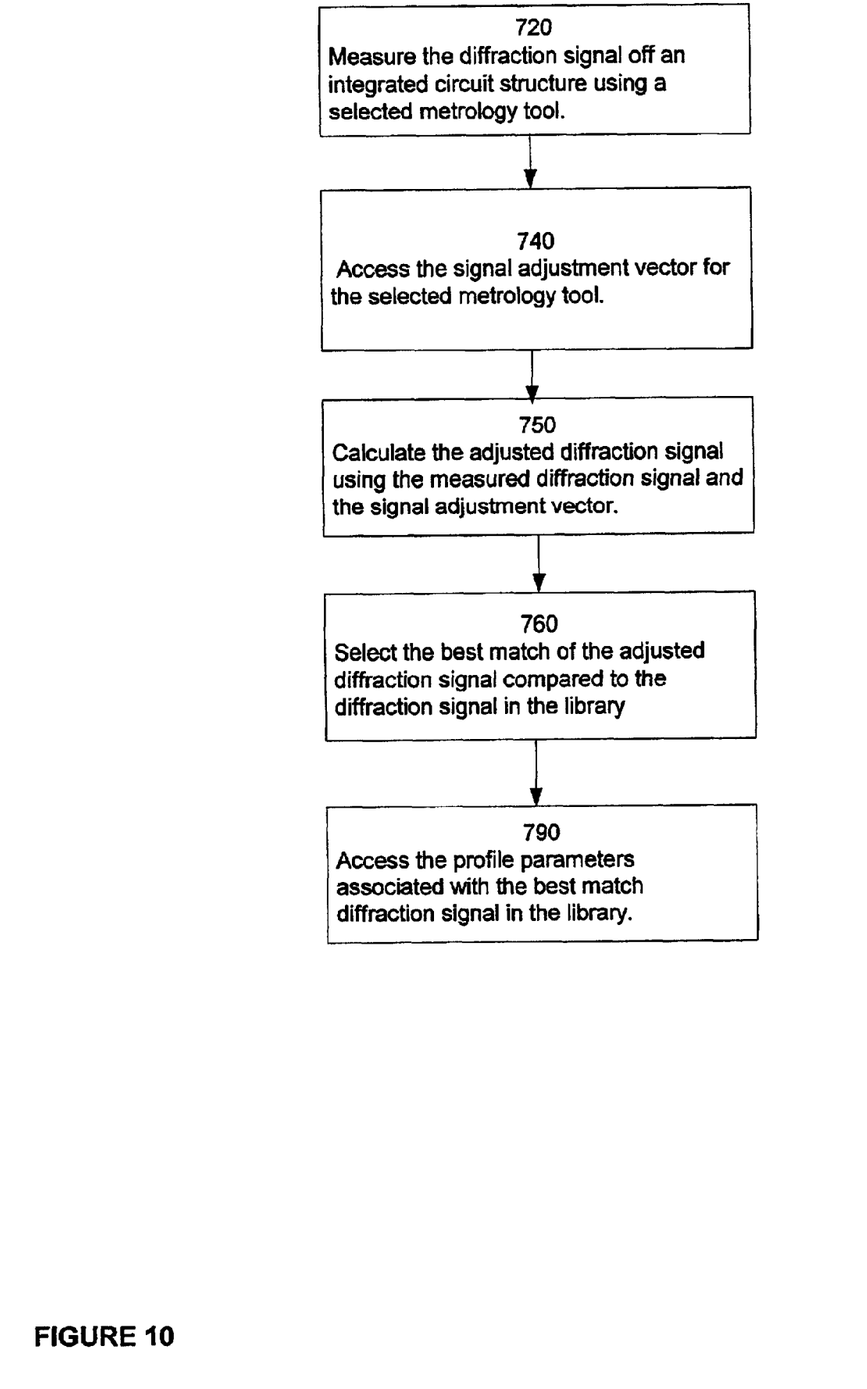
FIG. 10 is a flowchart of the steps for using the signal adjustment vector in one embodiment of the present invention.

FIG. 10 is a flowchart of the steps for using the signal adjustment vector in one embodiment. In step 720, the diffraction signal off an integrated circuit structure is measured using a selected metrology tool. In step 740, the signal adjustment vector specific to the selected metrology tool and selected library is accessed. In step 750, adjustment of the diffraction signal is done by applying the signal adjustment vector to the measured diffraction signal. In step 760, the adjusted diffraction signal is compared to the selected library of diffraction signals and associated profiles. In step 780, the profile associated with the best match diffraction signal is accessed.

There are several applications of the concepts and principles of the present invention. For example, a standard or "ideal" library of diffraction signals and associated profiles may be created for a standard or "ideal" metrology tool. Using a standard wafer with a specified number of sites, the sites are measured using one or more metrology tools similar to the standard metrology tool. Following the process steps discussed above, a signal adjustment vector is calculated for the one or more metrology tools. The signal adjustment vector may be saved in a data store together with identifying information for the library and the specific metrology tool. By associating a signal adjustment vector with identifying library and tool information, a metrology tool may be used with different libraries for as long as a signal adjustment vector had previously been calculated. The data store containing the signal adjustment vectors may be stored in a centralized data store and accessed as needed through a networked connection.

It is not intended that the invention be restricted to the exact embodiments described herein. It is clear to one skilled in the art that modifications to the exact method can be made without departing from the inventive concept. The method may be used not only to calibrate the library diffraction signal between different pieces of hardware, but also to calibrate the library diffraction signal over time for a single piece of hardware, to compensate for wear-induced drifting of hardware parameters. In addition to spectroscopic ellipsometers and reflectometers, the method of the present invention of utilizing an adjustment vector may also be applied to other optical metrology tools utilizing specialized beams such as lasers and to other kinds of metrology tools such as electron, or mechanical metrology devices. Examples of electron metrology devices include CD-scanning electron microscope (CD-SEM), transmission electron microscope (TEM), and focused ion beam (FIB) devices. An example of a mechanical metrology device is an atomic force microscope (AFM). The scope of the present invention should be construed in view of the claims that follow.

We claim:

1. A method in integrated circuit astrology for adapting a metrology system to work with diverse astrology devices, the method comprising:
   measuring a set of sites on a wafer utilizing a first metrology device, the measurement generating a first set of diffraction signals, the first astrology device having identifying specifications;
   measuring the set of sites on the wafer utilizing a second metrology device, the measurement generating a second set of diffraction signals, the second metrology device having identifying specifications;
   calculating differences between each signal of the first set of diffraction signals and the corresponding signal of the second set of diffraction signals; and
   determining a signal adjustment vector from the calculated differences, the signal adjustment vector configured to enable metrology data created for the first metrology device to be used in the second astrology device.

2. The method of claim 1 wherein the first astrology device is a reference metrology device with a known set of specifications, the known set of specifications being used in creating the metrology data.

3. The method of claim 1 wherein the astrology data comprise a library of diffraction signals and corresponding profile data.

4. The method of claim 3 further comprising:
   measuring a diffraction signal off an integrated circuit structure using the second metrology device, the measurement generating a measured structure diffraction signal;
   calculating an adjusted diffraction signal utilizing the measured structure diffraction signal and the signal adjustment vector;
   selecting a best match of the adjusted diffraction signal compared to diffraction signals in the library of diffraction signals and corresponding profile dara, the library created for the first metrology device; and
   accessing the profile data corresponding to the selected best match library diffraction signal.

5. The method of claim 4 wherein the first and second metrology devices are ellipsometers and wherein each of the first and second set of diffraction signals comprises tangent ($\Psi$) and cosine ($\Delta$) diffraction data.

6. The method of claim 4 wherein the first and second metrology devices are reflectometers and wherein each of the first and second set of diffraction signals comprises intensity diffraction data.

7. The method of claim 1 wherein determining the signal adjustment vector comprises performing a mathematical algorithm to compute the values of elements of the signal adjustment vector.

8. The method of claim 7 wherein the mathematical algorithm used to compute the element values is a clustering algorithm.

9. The method of claim 1 further comprising:
   storing the signal adjustment vector and identifying specifications of the first and second metrology device.

10. A method in integrated circuit metrology for adapting a metrology system to work with diverse metrology devices, the method comprising:
    measuring a set of sites on a wafer utilizing a first metrology device, the measurement generating a first set of diffraction signals, the first metrology device having identifying specifications;

measuring the set of sites on the wafer utilizing one or more second metrology devices, each measurement generating a second set of diffraction signals, each second metrology device having identifying specifications;

calculating differences between each signal of the first set of diffraction signals and the corresponding signal of the second sets of diffraction signals;

determining a signal adjustment vectors from the calculated differences, each signal adjustment vector configured to enable metrology data created for the first metrology device to be used in a corresponding second metrology device; and storing data elements comprising the identifying specifications of the first metrology device, identifying specifications of the second metrology device, and the associated signal adjustment vector.

11. The method of claim 10 wherein storing the data elements is performed by storing the data elements in a data store.

12. A system for adapting an integrated circuit metrology system to work with a plurality of metrology devices, the method comprising:

a first metrology device configured to generate a first set of diffraction signals off a set of structures in a wafer, the first metrology device having identifying specifications;

a second metrology device configured to generate a second set of diffraction signals off the set of structures in the wafer, the second metrology device having identifying specifications; and an estimator configured to calculate differences between each signal of the first set of diffraction signals and the corresponding signal of the second set of diffraction signals and configured to determine a signal adjustment vector from the calculated differences, wherein the signal adjustment vector enables metrology signal data created for use in the first metrology device to be used in the second metrology device.

13. The system of claim 12 wherein the first metrology device and the second metrology device are ellipsometers.

14. The system of claim 12 wherein the first metrology device and the second metrology device are reflectometers.

15. The system of claim 12 further comprising:

a profile library configured to contain diffraction signals and associated profile data; and a profile application server configured to process measured diffraction signals and select a best match of to measured diffraction signal compared to the diffraction signal of the profile library.

16. The system of claim 15 further comprising:

a data store coupled to the profile application server, the data store configured to store one or more signal adjustment vectors and metrology tool identifying specifications.

17. The system of claim 16 wherein the data store is accessible via a network connection.

18. The system of claim 16 wherein the estimator uses averaging to determine the signal adjustment vectors.

19. The system of claim 16 wherein the estimator uses a statistical averaging algorithm to determine the signal adjustment vectors.

20. The system of claim 16 wherein the estimator uses clustering algorithm to determine the signal adjustment vectors.

21. A system for storing integrated circuit metrology signal adjustment data and responding to request for signal adaptation, the system comprising:

a query device configured to send a query including identifying information about a metrology device and identifying information about a library of diffraction signals and associated profiles;

a signal adjustment server coupled to the query device and configured to process the query and configured to format and transmit a response to the query device; and a data store couple to the signal adjustment server and configured to store signal adjustment data, identifying information about metrology devices, and identifying information about a library of diffraction signals and associated profiles, wherein the signal adjustment data includes one or more signal adjustment vectors, wherein each signal adjustment vector is determined from calculating differences between a diffraction signal generated by measuring a site on a wafer utilizing a first metrology device and a diffraction signal generated by measuring the site on the wafer utilizing a second metrology device.

22. The system of claim 21 wherein the signal adjustment server is further configured to calculate an adjusted diffraction signal, the adjusted diffraction signal calculated from a measured diffraction signal and the corresponding signal adjustment data.

23. The system of claim 22 wherein the query from the query device includes the measured diffraction signal and the response from the signal adjustment server includes the adjusted diffraction signal, the adjusted diffraction signal calculated from the measured diffraction signal and the corresponding signal adjustment data.

24. The system of claim 21 wherein the query device is a metrology system, the metrology system including the identified metrology device.

25. The system of claim 23 further comprising:

a fabrication system coupled to the query device, the fabrication system including a lithography unit and/or an etch unit.

26. A computer-readable storage medium containing computer executable code to adapt a metrology system to work with diverse metrology devices by instructing a computer to operate as follows:

measuring a set of sites on a wafer utilizing a first metrology device, the measurement generating a first set of diffraction signals, the first metrology device having identifying specifications;

measuring the set of sites on the wafer utilizing a second metrology device, the measurement generating a second set of diffraction signals, the second metrology device having identifying specifications;

calculating differences between each signal of the first set of diffraction signals and the corresponding signal of the second set diffraction signals; and determining a signal adjustment vector from the calculated differences, the signal adjustment vector configured to enable metrology data created for the first metrology device to be used in the second metrology device.

27. A computer-readable storage medium containing computer executable code to adapt a metrology system to work with diverse metrology devices by instructing a computer to operate as follows:

measuring a set of sites on a wafer utilizing a first metrology device, the measurement generating a first set of diffraction signals, the first metrology device having identifying specifications;

measuring the set of sites on the wafer utilizing one or we second metrology devices, each measurement generating a second set of diffraction signals, each second metrology device having identifying specifications;

calculating differences between each signal of the first set of diffraction signals and the corresponding signal of the second sets of diffraction signals;

determining a signal adjustment vectors from the calculated differences, each signal adjustment vector configured to enable metrology data created for the first metrology device to be used in a corresponding second metrology device; and storing date elements comprising the identifying specifications of the first metrology device, identifying specifications of the second metrology device, and the associated signal adjustment vector.

28. A computer-readable storage medium containing stored data including:

identifying information for a primary metrology device;

identifying information for one or more secondary metrology devices;

identifying information for a library of diffraction signals and associated profiles; and one or more signal adjustment vectors, each signal adjustment vector determined from calculating differences between a diffraction signal generated by measuring a site on a wafer utilizing the primary metrology device and a diffraction signal generated by measuring the site on the wafer utilizing on of the one or more secondary metrology devices, wherein each signal adjustment vector is configured to adapt diffraction signals measured using the secondary metrology device to be operative with the identified library of diffraction signals and associated profiles.

* * * * *

UNITED STATES PATENT AND TRADEMARK OFFICE
CERTIFICATE OF CORRECTION

PATENT NO. : 6,792,328 B2  Page 1 of 1
DATED : September 14, 2004
INVENTOR(S) : Michael Laughery et al.

It is certified that error appears in the above-identified patent and that said Letters Patent is hereby corrected as shown below:

Drawings,
In Figure 7B, please replace "Site 4 Cosine Delta Comparison 110" with -- Site 4 Cosine Delta Comparison 108 --

Column 3,
Line 63, please replace "integrated fabrication" with -- integrated circuit fabrication --

Column 6,
Line 19, please replace "FIG. 7A" with -- FIG. 7B --

Column 8,
Lines 1, 2, 6, and 18, please replace "astrology" with -- metrology --
Lines 21 and 25, please replace "astrology" with -- metrology --
Line 39, please replace "dara" with -- data --

Column 9,
Line 22, please replace "the method comprising:" with -- the system comprising: --
Lines 50 and 51, please replace "match of to measured" with -- match of the measured --

Column 11,
Lines 3 and 4, please replace "one or we second" with -- one of more second --
Line 16, please replace "storing dara elements" with -- storing data elements --

Column 12,
Line 13, please replace "wafer utllizing on of the" with -- wafer utilizing one of the --
Line 16, please replace "using the secondary" with -- using a secondary --

Signed and Sealed this

Fifth Day of July, 2005

JON W. DUDAS
*Director of the United States Patent and Trademark Office*